(12) United States Patent
Rodriguez et al.

(10) Patent No.: US 11,862,887 B2
(45) Date of Patent: Jan. 2, 2024

(54) LATERALLY REMOVABLE PIN COVER TO PROTECT SOCKET CONNECTOR PINS

(71) Applicant: Microsoft Technology Licensing, LLC, Redmond, WA (US)

(72) Inventors: Benito Joseph Rodriguez, Redmond, WA (US); Anand Avinash Kulkarni, Sammamish, WA (US); Rameez Kadar Kazi, Bellevue, WA (US); Christy Felix Pradeep Antony, Mississauga (CA); Robert Forrest Koerner, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 158 days.

(21) Appl. No.: 17/196,632

(22) Filed: Mar. 9, 2021

(65) Prior Publication Data

US 2022/0294150 A1    Sep. 15, 2022

(51) Int. Cl.
| | | |
|---|---|---|
| *H01R 13/453* | (2006.01) | |
| *H01R 12/70* | (2011.01) | |
| *H01R 13/04* | (2006.01) | |
| *H01R 13/621* | (2006.01) | |

(52) U.S. Cl.
CPC ..... *H01R 13/4534* (2013.01); *H01R 12/7047* (2013.01); *H01R 13/04* (2013.01); *H01R 13/621* (2013.01)

(58) Field of Classification Search
CPC .. H01F 13/4534; H01F 12/7047; H01F 13/04; H01F 13/621; H01F 13/443; H05K 7/1061; H01R 13/4534; H01R 12/7047; H01R 13/04; H01R 13/621; H01R 13/443
See application file for complete search history.

(56) References Cited

U.S. PATENT DOCUMENTS

| | | | | |
|---|---|---|---|---|
| 6,086,402 A | * | 7/2000 | Huang | H05K 7/1053 |
| | | | | 439/342 |
| 6,203,356 B1 | | 3/2001 | Thomsen | |
| 8,905,765 B2 | * | 12/2014 | Yeh | H05K 7/00 |
| | | | | 439/73 |
| 2007/0114660 A1 | | 5/2007 | Wang | |

(Continued)

FOREIGN PATENT DOCUMENTS

| | | | | |
|---|---|---|---|---|
| CN | 101728699 A | * | 6/2010 | |
| EP | 1788623 A1 | | 5/2007 | |
| JP | 2009064677 A | * | 3/2009 | ......... H01R 13/2464 |

OTHER PUBLICATIONS

Machine Translation JP 2009064677-A, (Mar. 26, 2009) (Year: 2022).*

(Continued)

*Primary Examiner* — Travis S Chambers
(74) *Attorney, Agent, or Firm* — RAY QUINNEY & NEBEKER P.C.; Paul N. Taylor

(57) ABSTRACT

A socket used to connect a processor assembly to a PCB is protected during handling and/or processor installation using a laterally removable pin cover. To install the processor assembly, the processor assembly is paced in a cover removal position. While the processor assembly is in the cover removal position, the laterally removable pin cover is laterally removed from the socket. The processor assembly may then be placed into the installed position without ever exposing the connector pins on the socket.

25 Claims, 10 Drawing Sheets

(56) References Cited

U.S. PATENT DOCUMENTS

| | | |
|---|---|---|
| 2009/0111293 A1 | 4/2009 | Rubenstein et al. |
| 2014/0057470 A1 | 2/2014 | Yeh |
| 2014/0134880 A1 | 5/2014 | Yeh |
| 2015/0171527 A1 | 6/2015 | Krithivasan et al. |

OTHER PUBLICATIONS

Machine Translation CN 101728699-A, (Jun. 9, 2010) (Year: 2022).*
"International Search Report and Written Opinion Issued in PCT Application No. PCT/US22/017191", dated May 30, 2022, 17 Pages.

* cited by examiner

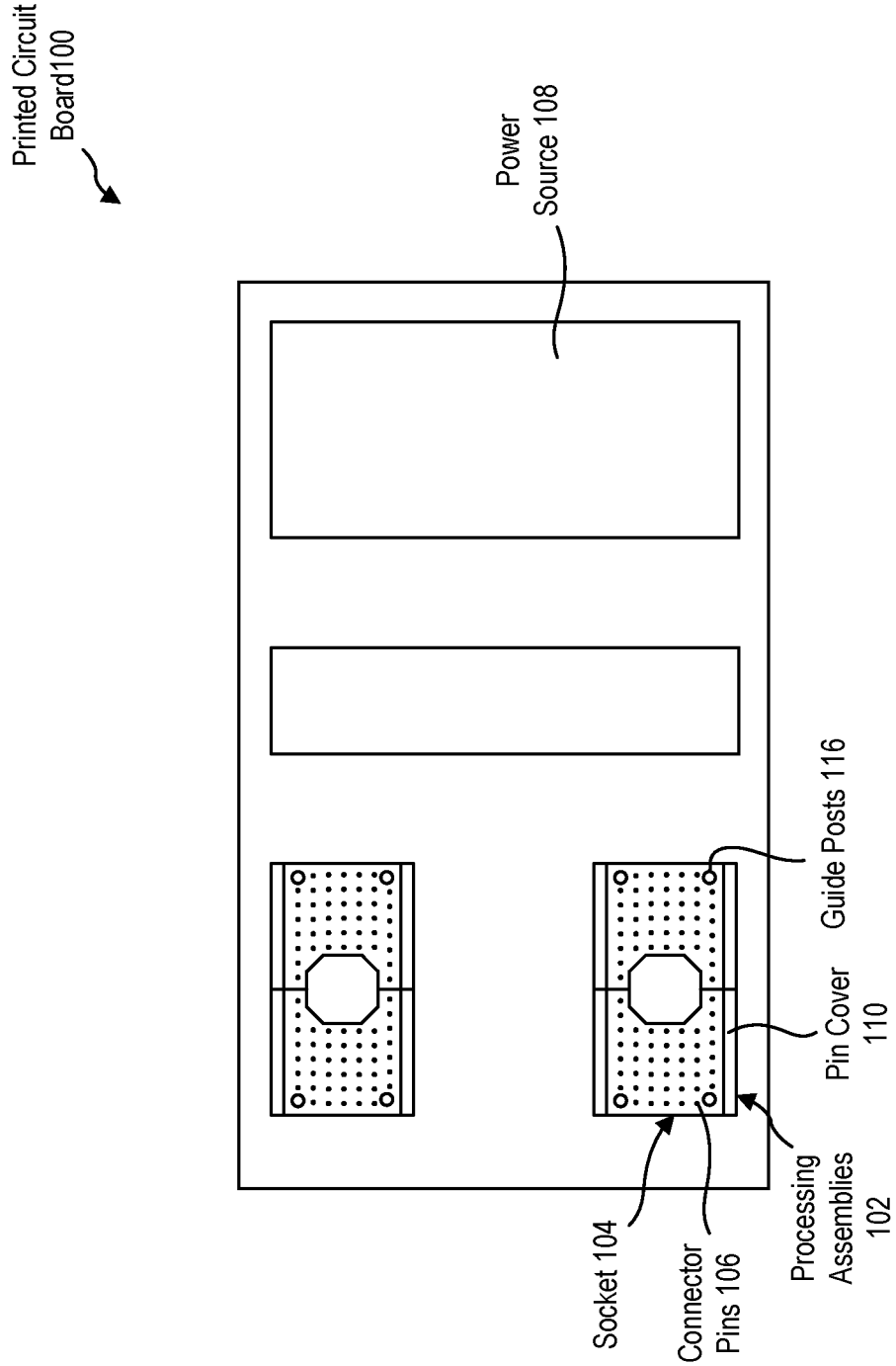

LATERALLY REMOVABLE PIN COVER TO PROTECT SOCKET CONNECTOR PINS

CROSS-REFERENCE TO RELATED APPLICATIONS

N/A.

BACKGROUND

Background and Relevant Art

Modern computing devices include various computing components connected to a printed circuit board (PCB). Such computing components typically include batteries, heat distribution systems, communication system, and one or more processors. A processor may be connected to the PCB via a socket. The socket may include one or more connector pins that connect to one or more connector pads on the processor. As modern processors have become smaller and more complex, the connector pins may become smaller and be placed on the socket with a higher density. Smaller connector pins may be fragile, and easily damaged during handling and/or installation of the processor.

BRIEF SUMMARY

In some embodiments, a system for protecting connector pins in a socket may comprise a socket to which the connector pins are connected and a laterally removable pin cover connected to the socket. To install a processor on the socket, the processor may be placed in a cover removal position. In the cover removal position, the laterally removal pin cover may be laterally removed from the socket. The processor may then be moved into the installed position. To remove the processor, the laterally removable pin cover may be inserted between the processor and the socket and the processor then removed.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIG. 1 is a representation of a PCB, according to at least one embodiment of the present disclosure;

FIG. 2-1 through FIG. 2-5 represent an installation sequence of a processor on a socket, according to at least one embodiment of the present disclosure;

FIG. 3-1 through FIG. 3-4 representation another installation sequence of a processor on a socket, according to at least one embodiment of the present disclosure;

FIG. 4 is a representation of a pin cover being installed on a socket, according to at least one embodiment of the present disclosure;

FIG. 5-1 is a representation of a top down view of a pin cover, according to at least one embodiment of the present disclosure;

FIG. 5-2 is a representation of the pin cover of FIG. 5-1 installed on a socket, according to at least one embodiment of the present disclosure;

DETAILED DESCRIPTION

This disclosure generally relates to devices, systems, and methods for protecting the connector pins on a socket prior to and/or during installation of a processor on the socket. A laterally removable pin cover may be installed on the socket. During installation of the processor, the processor may be placed on the socket over the pin cover. The pin cover may prevent the processor from contacting the connector pins when the processor is initially placed on the socket. When the processor is placed on the socket, the pin cover may be laterally removed. The processor may then be installed the rest of the way onto the socket such that the connector pins engage connector pads on the processor. Utilizing a pin cover over the socket may help to prevent damage to the connector pins during transport and assembly of a computing device.

Figures 1, 2:
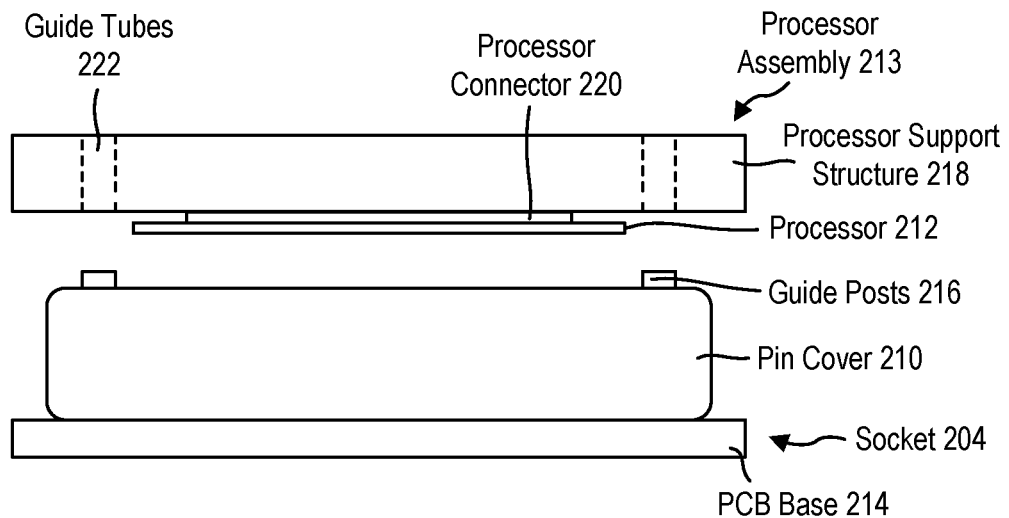
Figure 2:
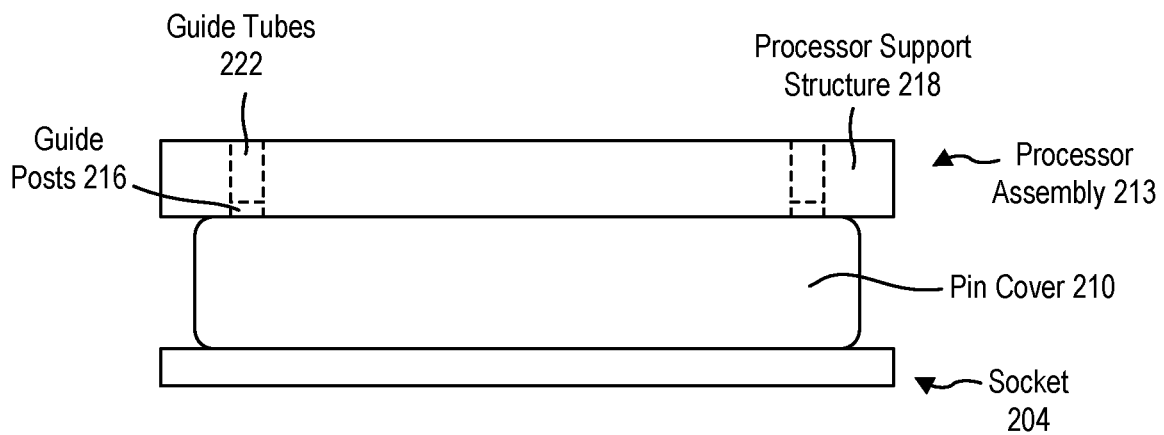

FIG. 1 is a representation of a printed circuit board (PCB) 100, according to at least one embodiment of the present disclosure. In some embodiments, the PCB 100 may be a computing device or a portion of a computing device. The PCB 100 may have one or more processing assemblies 102 connected to it. The processing assemblies 102 may include a processor. In some embodiments, the processor may be any processor used on a computing device. For example, the processor may be a central processing unit (CPU), a graphics processing unit (GPU), a vision processing unit (VPU), an application-specific integrated circuit (ASIC), any other processor, and combinations thereof.

The processor may be connected to the PCB 100 via a socket 104. The socket 104 may include a plurality of connector pins 106. The connector pins 106 may connect the processor to the PCB 100. This may allow the processor to interact with other elements of the PCB 100, receive power from a power source 108 (such as a battery), receive information, transmit information, any other interaction, and combinations thereof. In some embodiments, the quantity of connector pins 106 may be 10, 100, 500, 1,000, 2,000, 3,000, 4,000, 5,000, 10,000, greater than 10,000, or any value therebetween.

Modern computing trends have resulted in smaller processors that simultaneously have increased processing capacity. As smaller processors increase in processing capacity, the communication requirements with the PCB 100 may increase. This may result in a decreased size and an increased density of connector pins 106 on the socket 104. As the pin density increases, the size of individual connector pins 106 may decrease. The connector pins 106 may be fragile and easily damaged during transport and/or assembly of the PCB 100. For example, a light touch against the connector pins 106 may bend one or more of the connector pins 106. Bent connector pins 106 may not be able to contact the connector pads on the processor. In some cases, bent connector pins 106 on a socket 104 may necessitate replacement of the socket 104. This may increase the cost of the PCB 100 and increase user frustration during assembly of the PCB 100.

To protect the socket 104, a pin cover 110 may be installed on the socket 104. The pin cover 110 may prevent inadvertent contact with the connector pins 106. This may help to reduce damage to the connector pins 106. Typically, a conventional pin cover 110 may need to be removed prior to connecting the processor to the socket 104. This may allow for damage to the socket 104 and/or the connector pins 106 during the time between removal of the pin cover 110 and the connection of the processor. For example, a technician may inadvertently misalign the processor with the socket 104 and bump the socket 104, damaging the connector pins 106.

In accordance with embodiments of the present disclosure, the pin cover 110 may be removable when the processor is partially connected to the socket 104. During installation, the processor may be partially installed on the socket 104, such as by placing the processor in a cover removal position. After the processor is partially installed on the socket 104, the pin cover 110 may be removed. After the pin cover 110 is removed, the processor may be fully installed on the socket so that, in the installed position, the connector pins 106 contact and electrically connect to the connector pads on the processor. Removing the pin cover 110 while the processor is partially installed on the socket 104 may prevent the connector pins 106 from being exposed during installation. This may help to prevent or reduce inadvertent damage to the connector pins 106 during installation of the processor.

In some embodiments, the pin cover 110 may be a laterally removable pin cover 110. For example, after the processor is partially installed on the socket 104, the pin cover 110 may be pulled laterally (e.g., parallel or approximately parallel to the plane of the PCB 100) away from the socket 104. In this manner, the pin cover 110 may be removed while the processor is partially installed on the socket 104.

FIG. 2-1 through FIG. 2-5 represent a schematic installation sequence to install a processor 212 on a socket 204, according to at least one embodiment of the present disclosure. In the view shown in FIG. 2-1, the processor 212 is located above the socket 204 and ready to be moved downward to be installed on the socket 204. The socket 204 may include a PCB base 214 and a pin cover 210 secured to the PCB base 214. The pin cover 210 may be located over the connector pins 206 (see FIG. 2-3). Thus, as may be seen, the pin cover 210 may protect the connector pins 206 from exposure and/or damage during handling and/or installation of the processor 212.

The processor 212 may be a part of a processor assembly 213. In the embodiment shown, the processor assembly 213 includes a processor 212 connected to a processor support structure 218. The processor support structure 218 may be any support structure connected to a processor 212. For example, the processor support structure 218 may be a heat sink, such as a plurality of heat fins and/or a vapor chamber. The heat sink may collect heat generated during use by the processor 212 and radiate the heat away. In some embodiments, the heat sink may be connected to one or more heat transfer elements, such as a heat pipe, to further transfer heat away from the processor 212. In some embodiments, the processor support structure 218 may be any other support structure, including a structural support that connects to and reinforces a portion of the associated computing device. The processor 212 may be connected to the processor support structure 218 with a processor connector 220. The processor connector 220 may be any type of connector, including an adhesive, a thermally conductive material, a series of struts, any other type of connector, and combinations thereof.

In some embodiments, the processor 212 may be directly connected to the socket 204 without the processor support structure 218. For example, the processor 212 may include processor guide tubes 222 that receive the guide posts 216 and the mounting screws (see mounting screws 226 of FIG. 2-5) may directly secure the processor 212 to the socket. Thus, it should be understood that the installation sequence illustrated in FIG. 2-1 through FIG. 2-5 may be performed by the processor 212 directly, rather than the processor assembly 213. In some embodiments, the processor 212 may be installed on the socket 204 first, and the processor support structure 218 may subsequently be installed on the socket 204 after the processor 212 is connected to the socket 204.

The socket 204 may include one or more guide posts 216 extending upward from the socket base 214. The guide posts 216 may extend above the pin cover 210. The processor assembly 213 may include one or more guide tubes 222. The guide tubes 222 may be complementarily shaped to the guide posts 216. Put another way, the guide posts 216 may have a cross-sectional shape that is the same as a cross-sectional shape of the guide tubes 222 such that the guide posts 216 may be inserted into the guide tubes 222.

The processor assembly 213 may be moved into a cover removal position seen in FIG. 2-2, where the processor assembly 213 may be located above the pin cover 210. When the processor assembly 213 is moved into the cover removal position, the guide posts 216 may be inserted into the guide tubes 222. The guide posts 216 may help to orient and guide the processor assembly 213 into place on the socket 204. This may help the connector pads on the processor 212 to properly align with the connector pins 206 of the socket 204 (see FIG. 2-5).

In the view shown in FIG. 2-2, the processor assembly 213 is partially installed on the socket 204 in the cover removal position. In the cover removal position shown, the guide posts 216 may be partially inserted into the guide tubes 222. In the cover removal position, the guide posts 216 may help to orient and align the processor assembly 213 in the final alignment. In this manner, after the pin cover 210 is removed, the processor assembly 213 may simply be pushed into place, without any additional orienting or other lateral movement by the processor assembly. In some embodiments, in the cover removal position, the pin cover 210 may prevent the connector pads on the processor 212 from contacting the connector pins 206. This may help to reduce damage to the connector pins during installation.

In some embodiments, in the cover removal position, the processor assembly 213 may be placed on the socket 204 until the processor support structure 218 is in contact with the pin cover 210. In some embodiments, in the cover removal position, the processor assembly 213 may be placed on the socket 204 such that the guide posts 216 are inserted into the guide tubes 222 while the processor assembly 213 is located above the pin cover 210 without contacting the pin cover 210.

After the processor assembly 213 is placed in the cover removal position on the socket 204, the pin cover 210 may be laterally removed. For example, in the embodiment shown in FIG. 2-3, the pin cover 210 may be laterally removed by applying a lateral removal force 224. When the lateral removal force 224 is applied to the pin cover 210, the pin cover 210 may be slid out from the socket 204. In some embodiments, the pin cover 210 may slide out from the socket 204 between the pin cover 210 and the PCB base 214 of the socket 204.

Figures 2, 3:
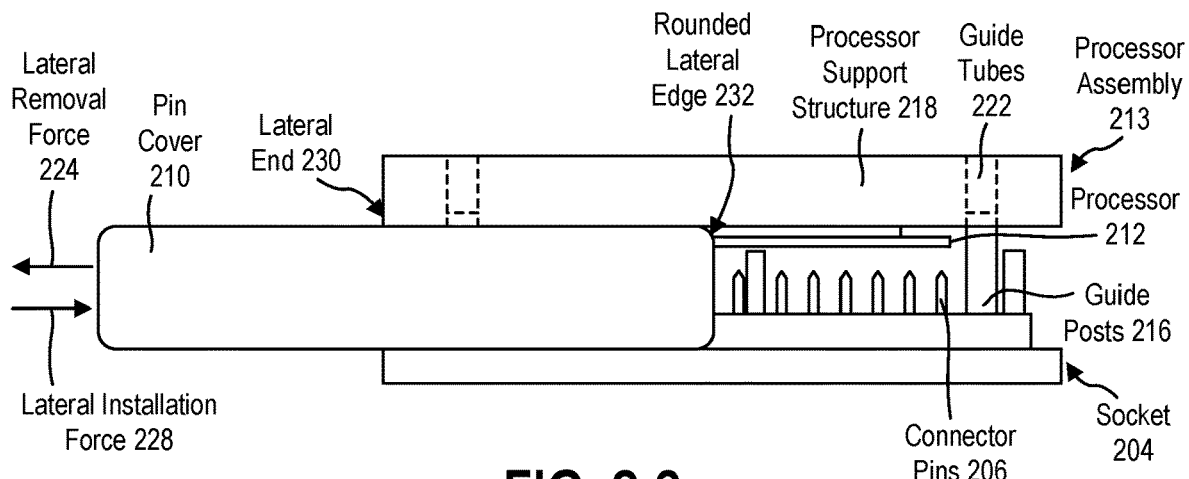

While in the embodiment shown in FIG. 2-3 the lateral removal force 224 is shown as being applied to the left as seen in the page, it should be understood that the lateral removal force 224 may be applied any lateral direction (e.g., any direction parallel or approximately parallel to the PCB). For example, the pin cover 210 may be laterally removed by applying the lateral removal force 224 out of the page. In some examples, the pin cover 210 may be laterally removed by applying the lateral removal force 224 to the right. In some embodiments, the lateral removal force 224 may be applied in any direction except up and down in the page, including a combination of right or left and out of the page.

As may be seen in FIG. 2-3, when the processor assembly 213 is in the cover removal position, the processor 212 may not contact the connector pins 206 (e.g., the contactor pads on the processor 212 may not contact the connector pins 206). In some embodiments, in the cover removal position, the pin cover 210 may prevent the processor 212 from contacting the connector pins 206. Furthermore, because the processor assembly 213 is aligned by the guide posts 216 inserted into the guide tubes 222, the processor assembly 213 may cover the connector pins 206 in the cover removal position. In this manner, during installation of the processor assembly 213 on the socket 204, and even after the pin cover 210 is removed, the connector pins 206 may never be exposed, or may only be exposed from the lateral position after the pin cover 210 is removed. This may help to prevent inadvertent damage to the connector pins 206 during manufacture, shipping and handling, and assembly of a computing device.

After the pin cover 210 is removed (see FIG. 2-4), the processor assembly 213 may be moved into the final installed position shown in FIG. 2-5. In some embodiments, the processor assembly 213 may remain in the cover removal position shown in FIG. 2-2 through FIG. 2-4 until it is moved into the installed position shown in FIG. 2-5. In some embodiments, to maintain the processor assembly 213 in the cover removal position, the guide posts 216 may include a position maintenance feature. In some embodiments, the position maintenance feature may include a friction fit between the guide post 216 and the guide tube 222. In a friction fit, the guide post 216 may have an outside diameter that is the same as or slightly larger than an inside diameter of the guide tube 222. A force greater than the force of gravity may need to be applied to the processor assembly to overcome the friction fit and move the processor assembly 213 down the guide posts 216.

In some embodiments, to maintain the processor assembly 213 in the cover removal position, the position maintenance feature may include one or more detents, or circumferential grooves, around the outer surface of the guide posts 216. The guide tubes 222 may include a matching annular protrusion on the inner surface of the guide tubes 222. As the processor assembly 213 is lowered onto the guide posts 216, the protrusion on the guide tubes 222 may enter into the matching detent. When the protrusion is inserted into the matching detent, a large force may be required to move the processor assembly out of the cover removal position. This may help to maintain the cover removal position of the processor assembly 213 while the pin cover 210 is being removed. Increasing the force needed to move the processor assembly 213 from the cover removal position may help to prevent the processor assembly 213 from becoming dislodged while the pin cover 210 is being removed. In some embodiments, the guide tubes 222 may include the detent on an inner surface of the guide tubes 222, and the guide posts 216 may include the protrusion on an outer surface of the guide post 216. Maintaining the processor assembly 213 in the cover removal position before, during, and after removal of the pin cover 210 may help to prevent inadvertent removal of the processor.

The socket 204 may include any number of guide posts 216. For example, the socket 204 may include 1, 2, 3, 4, 5, 6, 7, 8, 9, 10, or more guide posts 216. In the embodiment shown in FIG. 2-1 through FIG. 2-5, the socket 204 includes two guide posts 216. In the embodiment shown in FIG. 1, the socket 104 includes four guide posts 116. Increasing the number of guide posts 216 may help to increase the accuracy and/or precision of the alignment of the processor assembly 213 on the socket 204. In some embodiments, each guide post 216 may have a position maintenance feature. In some embodiments, one or more guide posts 216 may have a position maintenance feature and one or more guide posts 216 may not have a position maintenance feature. For example, a socket 204 may include four guide posts 216, and two of the guide posts 216 may include a position maintenance feature. In some examples, one of the guide posts 216 may include a position maintenance feature. In some examples, three of the guide posts 216 may include a position maintenance feature.

In some embodiments, each guide post 216 having a position maintenance feature may have the same position maintenance feature. In some embodiments, different guide posts 216 may have different position maintenance features. For example, a first guide post 216 may have a friction fit with a guide tube 222 and a second guide posts 216 may have a detent with a matching protrusion in the guide tube 222. This may further help to align the processor assembly 213 over the socket 204 and maintain the processor assembly 213 in the cover removal position while the pin cover 210 is being removed.

FIG. 2-5 shows the processor assembly 213 in the fully installed position on the socket 204. In the installed position shown, the processor 212 is in contact with the plurality of connector pins 206 (e.g., the connector pads are in contact with their respective connector pins 206). The processor assembly 213 may be secured to the socket 204 using one or more mounting screws 226. As may be seen in the installation sequence shown in FIG. 2-1 through FIG. 2-5, the processor assembly 213 may be installed without exposing the connector pins 206. This may help to protect the connector pins 206 and prevent the processor 212 from malfunctioning and/or prevent replacement of the processor 212.

To remove the processor assembly 213 from the socket 204, the installation sequence shown in FIG. 2-1 through FIG. 2-5 may be reversed. During the removal sequence, the mounting screws 226 of FIG. 2-5 may be removed, and the processor assembly 213 may be moved from the installed position to the cover removal position shown in FIG. 2-4. While the processor assembly 213 is in the cover removal position, the pin cover 210 may be laterally installed (e.g., slid into place) between the processor assembly 213 and the socket 204. As may be seen in FIG. 2-3, to install the pin cover 210, a lateral installation force 228 may be applied to the pin cover 210 to slide the pin cover 210 in between the processor assembly 213 and the socket 204.

While in the embodiment shown in FIG. 2-3 the lateral installation force 228 is shown as being applied to the right as seen in the page, it should be understood that the lateral installation force 228 may be applied any lateral direction. For example, the pin cover 210 may be laterally installed by applying the lateral installation force 228 into the page. In some examples, the pin cover 210 may be laterally installed by applying the lateral installation force 228 to the right. In some embodiments, the lateral installation force 228 may be applied in any direction except up and down in the page, including a combination of right or left and into the page.

In some embodiments, the processor assembly 213 may be moved into the cover removal position by the user. After the mounting screws 226 have been removed, the user may pull on the processor assembly 213 until the processor assembly has reached the cover removal position. In some embodiments, the position maintenance features discussed herein may help the user to know how far to pull out the processor assembly 213. For example, the user may pull on the processor assembly 213 until protrusion in the guide tube 222 is inserted into a detent on the guide post 216 (or until a protrusion on the guide post 216 is inserted into a detent in the guide tube 222). When the protrusion enters the detent, the user may feel a change in the force used to remove the processor assembly 213 further (such as a click, or an increase in the necessary removal force). This change in removal force may alert the user that the processor assembly 213 is in the cover removal position shown in FIG. 2-4, and that the pin cover 210 is ready to be installed. Using a position maintenance feature to determine when the processor assembly 213 is in the cover removal position may help the user to laterally install the pin cover 210 without accidently fully removing the processor assembly.

In some embodiments, after the mounting screws 226 have been removed, the processor assembly 213 may be moved into the cover removal position using the pin cover 210. For example, when the processor assembly 213 is in the installed position shown in FIG. 2-5, the pin cover 210 may be pressed up against the lateral end 230 of the processor assembly 213. The pin cover 210 may include a rounded lateral edge 232. By applying the lateral installation force 228 against the pin cover 210, the rounded lateral edge 232 may transfer that force to the processor support structure 218. At least a portion of the lateral installation force 228 may be converted to an upward force by the rounded lateral edge 232, which may push the processor assembly 213 upward into the cover removal position shown in FIG. 2-3. Thus, in some embodiments, the pin cover 210 disconnects the processor assembly 213 from the socket 204. Put another way, the pin cover 210 may disconnect the plurality of connector pads from the connector pins 206. This may reduce the need for an operator or technician to physically pull on the processor assembly 213 before the pin cover 210 is in place.

After the pin cover 210 has been laterally moved into place (see FIG. 2-2), the processor assembly 213 may be fully removed (see FIG. 2-1). As may be seen, installing the pin cover 210 before the processor assembly 213 has been fully removed may prevent the connector pins 206 from being exposed during removal of the processor assembly 213. This may help to prevent damage to the socket 204. For example, if the processor 212 is being replaced, such as to replace a faulty processor, upgrade the processor, or any other reason, the old processor 212 may be removed and the new processor 212 installed without exposing the connector pins 206. This may help reduce the replacement costs of a new processor 212 that can utilize the same socket 204.

Figures 2, 3, 4:
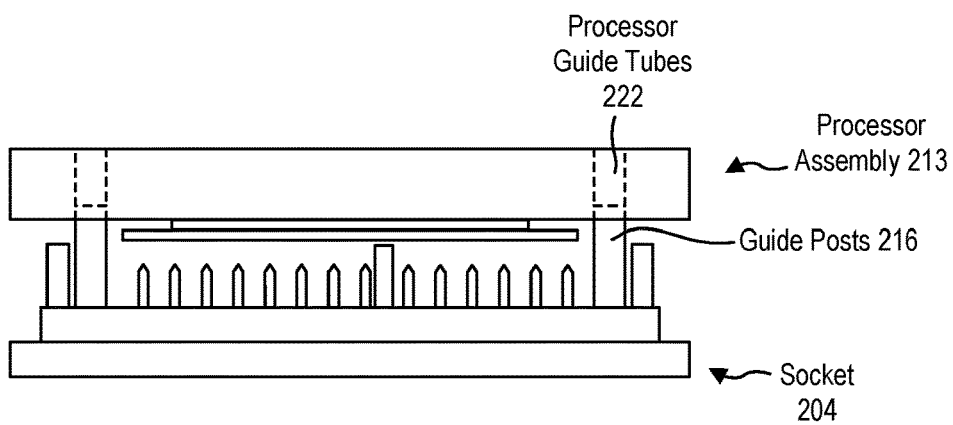

FIG. 3-1 through FIG. 3-4 represent a schematic installation sequence of a processor assembly 313 on a socket 304, according to at least one embodiment of the present disclosure. As may be seen in FIG. 3-1, the pin cover 310 may be secured to the socket 304 with a latch 334. In some embodiments, the latch 334 may prevent the pin cover 310 from being removed from the socket 304. For example, the latch 334 may prevent the pin cover 310 from being removed in a vertical direction 336. In some examples, the latch 334 may prevent the pin cover 310 from being removed in a lateral direction 338. In some examples, the latch 334 may prevent the pin cover 310 from being removed in a vertical direction 336 and a lateral direction 338. Preventing the pin cover 310 from being removed may help to protect the socket 304 during handling and/or installation of the processor assembly 313.

To install the processor assembly 313 on the socket 304, the processor assembly 313 may be lowered in the vertical direction 336 onto the socket. One or more guide posts 316 may extend above the pin cover 310. In some embodiments, the guide posts 316 may extend above the latch 334. The guide posts 316 may be inserted into corresponding guide tubes 322. Insertion of the guide posts 316 into the guide tubes 322 may align and/or orient the processor assembly 313 onto the socket 304.

The processor assembly 313 may be lowered into the cover removal position shown in FIG. 3-2. In some embodiments, the processor assembly 313 may be lowered down the guide posts 316. In some embodiments, the processor assembly 313 may be maintained in the cover removal position with one or more position maintenance features, as discussed herein.

When the processor assembly 313 is located in the cover removal position, the latch 334 may be unlatched (e.g., placed from a latched position shown in FIG. 3-1 into an unlatched position shown in FIG. 3-2) from the pin cover 310. In some embodiments, the latch 334 may be manually unlatched by the user or technician installing the processor assembly 313. For example, the user may rotate the latch 334 outward with a finger or tool such that removal of the pin cover 310 is no longer prevented by the latch 334. In some embodiments, the user may completely remove the latch 334. For example, when preparing to install the processor assembly 313 in the cover removal position, the user may remove the latch 334 from the socket 304 before inserting the processor assembly 313 onto the guide posts 316. In some embodiments, the user may remove the latch 334 after the processor assembly 313 is placed in the cover removal position.

In some embodiments, the latch 334 may be unlatched by the processor assembly 313 when the processor assembly is placed into the cover removal position shown in FIG. 3-2. For example, as the processor assembly 313 is lowered down the guide posts 316, the processor support structure 318 may engage a contact edge 340 of the latch 334. This contact may move the latch 334 from the latched position of FIG. 3-1 to the unlatched position of FIG. 3-2. After the latch 334 is moved from the latched position to the unlatched position, the pin cover 310 may be laterally removed from the socket 304.

Unlatching the latch 334 by moving the processor assembly 313 into the cover removal position may help to prevent inadvertent removal of the pin cover 310 from the socket 304. As discussed above, the latch 334 may prevent the pin cover 310 from being removed before the processor assembly 313 is installed in the cover removal position. In this manner, the pin cover 310 may not be removed until the user is ready for it to be removed. Furthermore, unlatching the latch with the processor assembly 313 may increase the ease of installation of the processor assembly 313. For example, the user may not need to perform any additional actions to unlatch the latch 334. In this manner, the pin cover 310 may be more fully secured to the socket 304 without increasing the installation complexity experienced by the user.

After the pin cover 310 is laterally removed from between the processor assembly 313 and the socket 304, the processor assembly 313 may be connected to the socket 304 using one or more mounting screws 326, as shown in FIG. 3-3. In some embodiments, when the processor assembly 313 is connected to the socket 304, the latch 334 may latch on to the processor assembly 313, such as latching onto the processor support structure 318. Latching the processor assembly 313 to the socket 304 may help to prevent the processor assembly 313 from being removed until the processor assembly 313 is ready to be removed. This may help to prevent exposure of the connector pins 306 and reduce inadvertent damage to the socket pins 306.

To remove the latched processor assembly 313, the pin cover 310 may be laterally inserted onto the socket 304, as may be seen in FIG. 3-4. The pin cover 310 may be pushed laterally until it comes into contact with the latch 334. This may push the latch 334 from the latched position shown in FIG. 3-3 to the unlatched position shown in FIG. 3-4. Thus, when a user wishes to replace the processor assembly 313, the user may laterally push the pin cover 310 until it unlatches the latch 334. The processor assembly 313 may then be removed. In this manner, the processor assembly 313 may be replaced without exposing the socket 304 and the connector pins 306. By latching the processor assembly 313 to the socket 304, the processor assembly 313 may not be removed until the pin cover 310 is in place, thereby protecting the socket 304 from damage.

FIG. 4 is a representation of a PCB assembly 400 with a processor assembly 413 being installed on a socket 404, according to at least one embodiment of the present disclosure. In the embodiment shown, the processor assembly 413 may include a spreader 442. Using the spreader 442, the processor assembly 413 may laterally move one or more sections of the pin cover 410 as the processor assembly 413 moved in the vertical direction 436 onto the socket 404.

In some embodiments, the spreader 442 may include a wedge 444 or other contact surface. As the processor assembly 413 is moved onto the socket, the wedge 444 of the spreader 442 may come into contact with one or more sections of a pin cover 410. As the processor assembly 413 is further lowered onto the socket 404, the wedge 444 may push one or more sections of the pin cover 410 in the lateral direction 438.

In some embodiments, when the processor assembly 413 is fully installed on the socket 404, the spreader 442 may push on the one or more sections of the pin cover 410 until the pin cover 410 is dislodged from the socket 404. In some embodiments, the spreader 442 may push on the one or more sections of the pin cover 410 to make it easier for a user to grip the pin cover 410 for lateral removal.

In some embodiments, as discussed herein, the one or more guide posts 416 may be used to align the processor assembly 413. As the processor assembly 413 is moved down the guide posts 416 and the spreader 442 pushes against the pin covers 410, the guide posts 416 provide a counter force from the contact of the spreader 440 against the pin covers 410. In some embodiments, the guide posts 416 may be sufficiently strong to maintain alignment of the processor assembly with respect to the socket 404.

In some embodiments, a spreader 442 may push against a single section of the pin cover 410. In some embodiments, a spreader 442 may push against multiple sections of the pin cover 410. For example, in the embodiment shown in FIG. 4, the spreader 442 has a wedge 444 that pushes against a first section of the pin cover 410-1 and a second section of the second pin cover 410-2. In some embodiments, the spreader 442 may push the first section of the pin cover 410-1 and the second section of the pin cover 410-2 in the same direction. In some embodiments, the spreader 442 may push the first section of the pin cover 410-1 in a first direction (e.g., to the left in the embodiment shown) and the second section of the pin cover 410-2 in a second direction (e.g., to the right in the embodiment shown).

Utilizing a spreader 442 to laterally move the pin covers 410 may increase the ease of installation of the processor assembly 413. For example, laterally moving the pin covers 410 may remove the pin cover 410 from the socket 404, which may reduce the interaction between the user and the socket 404. In some examples, laterally moving the pin cover 410 may make the pin cover 410 easier for the user to remove.

In some embodiments, to remove the processor assembly 413, the user may apply a lateral force to a section of the pin cover 410 when the processor assembly 413 is in the installed position. The pin cover 410 may engage the wedge 444 of the spreader 442, and a portion of the lateral force may be converted to an upward force. The processor assembly 413 may be urged upward until the pin cover 410 is in place. In this manner, the processor assembly 413 may be removed without exposing the connector pins in the socket 404.

Figures 2, 3, 4, 5:
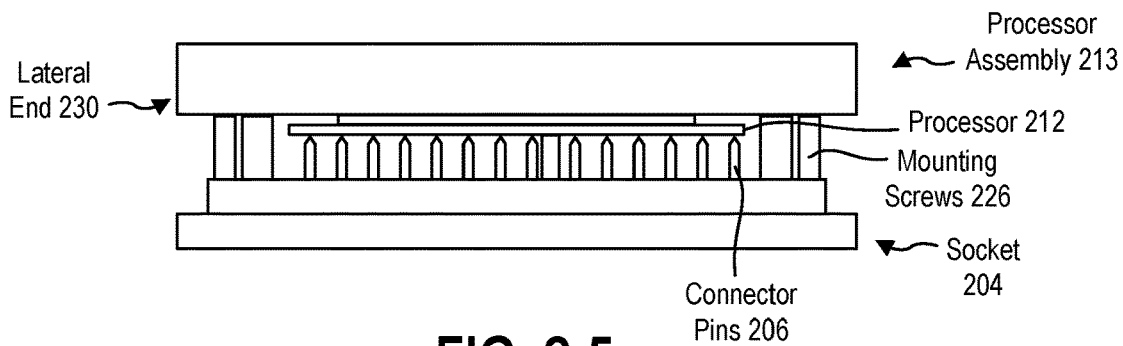
Figures 1, 3:
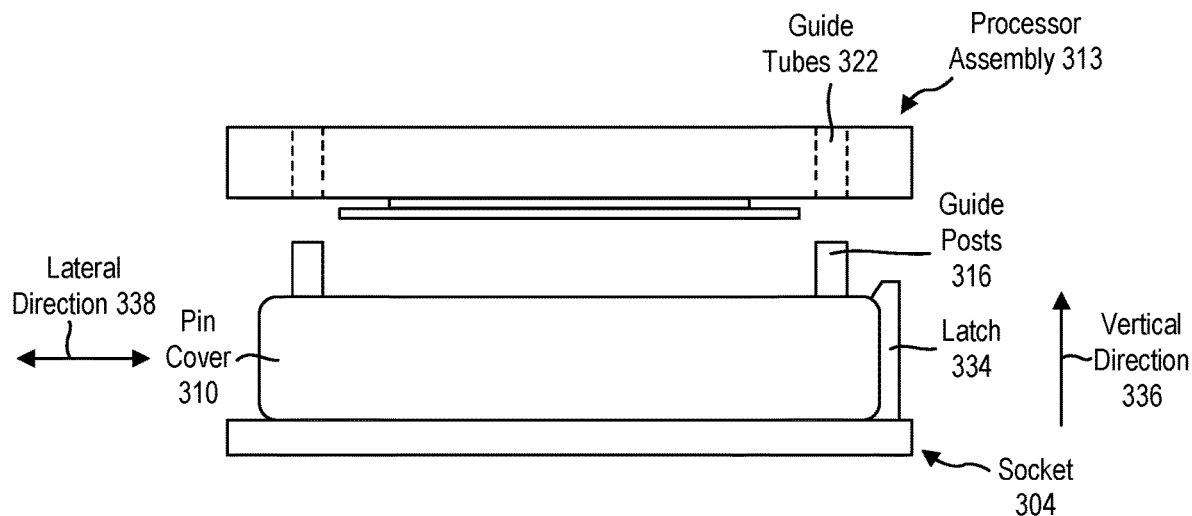
Figures 2, 3:
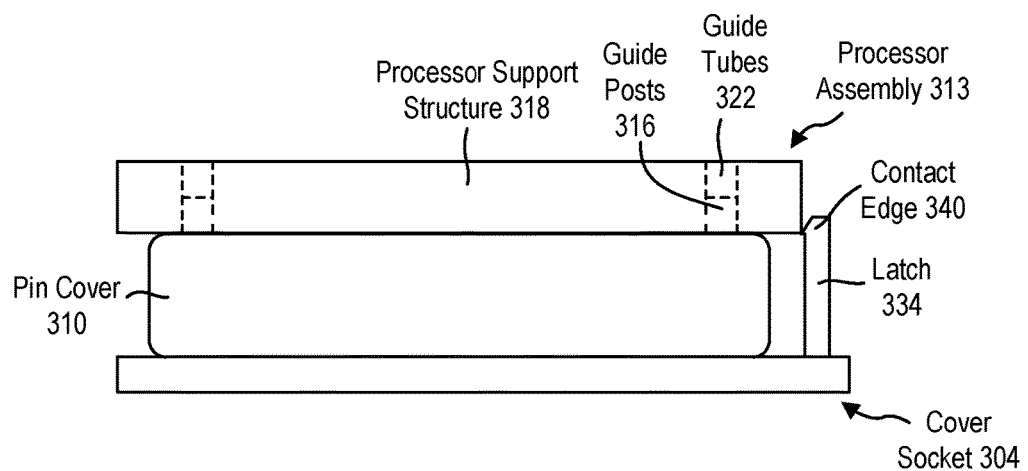
Figure 3:
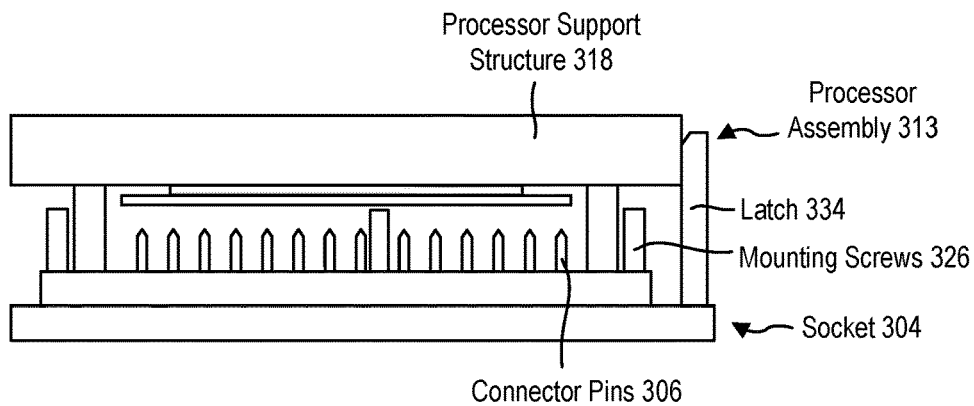
Figures 3, 4:
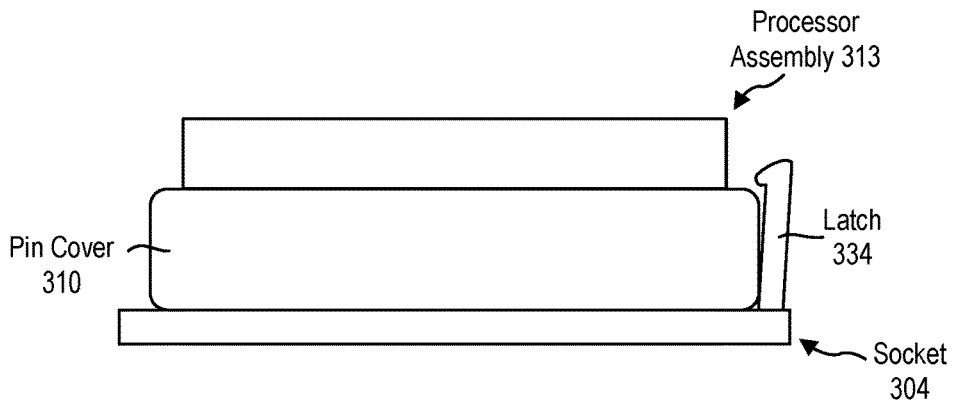
Figure 4:
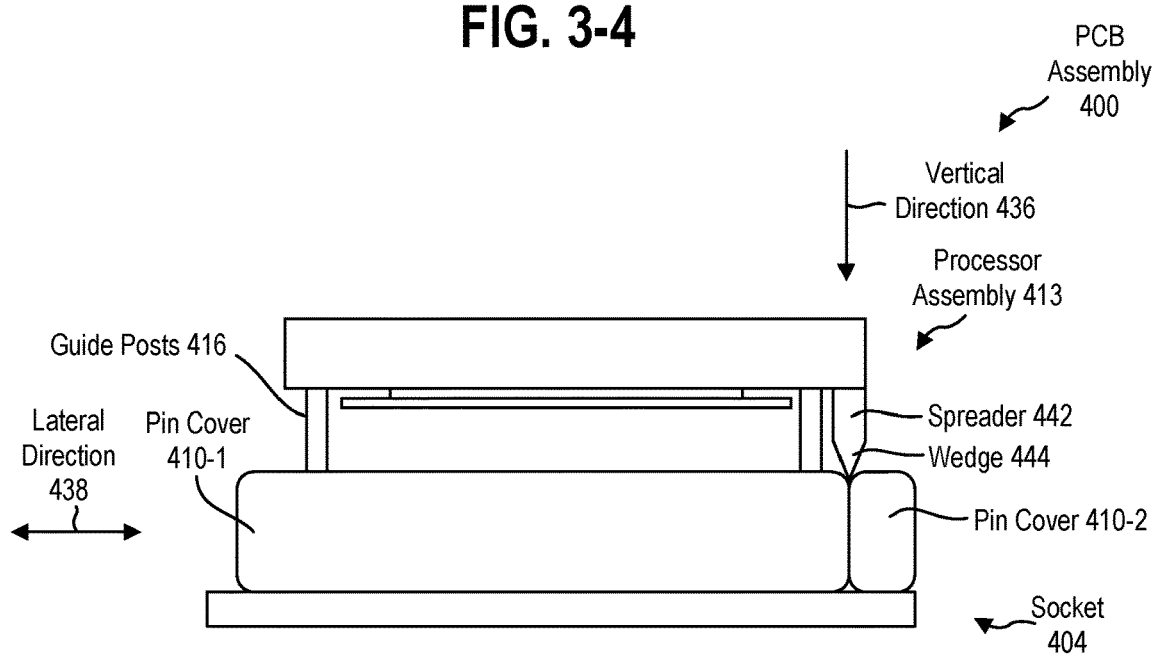
Figures 1, 5:
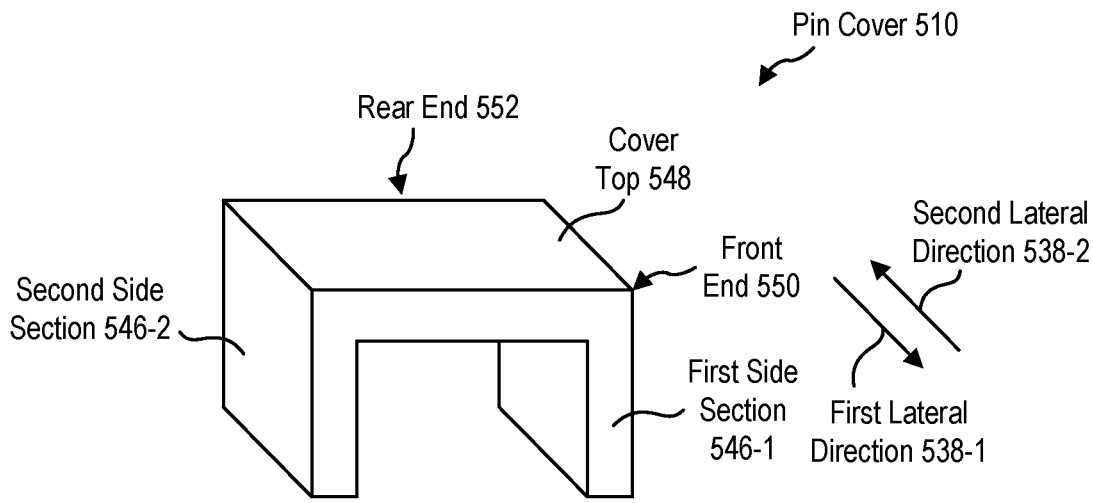
Figures 2, 5:
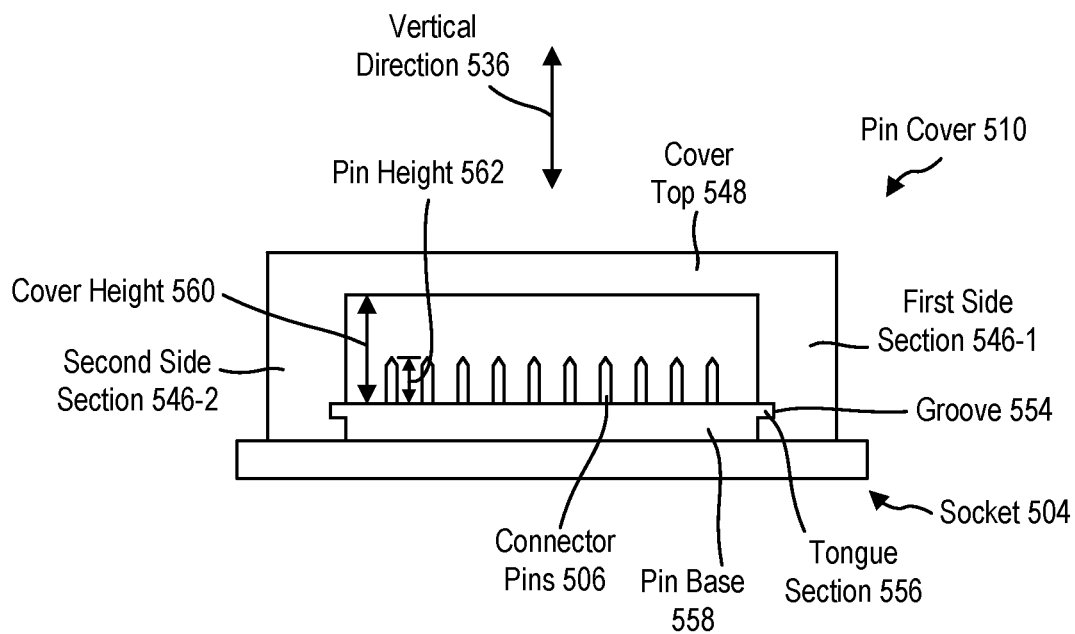

FIG. 5-1 is a representation of a top down view of a pin cover 510, according to at least one embodiment of the present disclosure. The pin cover 510 may include a first side section 546-1 and a second side section 546-2. In some embodiments, the first side section 546-1 may be configured to connect to a socket (e.g., the socket 104 of FIG. 1) on a first side. The second side section 546-2 may be configured to connect to the socket on a second side. In some embodiments, the connector pins on the socket may be located between the first side and the second side of the socket. Thus, the pin cover 510 may straddle the socket and the connector pins of the socket between the first side section 546-1 and the second side section 546-2.

In some embodiments, a cover top 548 may extend between the first side section 546-1 and the second side section 546-2. The cover top 548 may extend over the top of the connector pins. The cover top 548 may provide protection for the connector pins from inadvertent damage caused during handling and/or assembly of a processor assembly on the socket.

In some embodiments, the first side section 546-1 and the second side section 546-2 may be connected to the socket. To remove the pin cover 510, the pin cover may be moved in a first lateral direction 538-1 or a second lateral direction 538-1. Because the first side section 546-1 and the second side section 546-2 are connected to the socket, the pin cover 510 may not be moved in a third lateral direction 568-1 or a fourth lateral direction 568-2.

The pin cover 510 includes a front end 550 and a rear end 552. In some embodiments, one or both of the front end 550 and the rear end 552 may be open. Put another way, on an open end, the cover top 548 may terminate at the front end 550 or the rear end 552 without contacting the socket, or at a height that is greater than a connector pin height. An open end may be slid over the socket without contacting and/or damaging the connector pins. Thus, if the front end 550 is open, the pin cover 510 may be removed from the socket in the second lateral direction 538-2. If the rear end 552 is open, the pin cover 510 may be removed from the socket in the first lateral direction 538-1. In some embodiments, the front end 550 may be closed and the rear end 552 may be open. In some embodiments, the rear end 552 may be closed and the front end 550 may be open. In some embodiments, both the front end 550 and the rear end 552 may be open.

FIG. 5-2 is a representation of a front view of the pin cover 510 of FIG. 5-1 installed on a socket 504. As may be seen, the pin cover 510 extends over the connector pins 506. Specifically, the cover top 548 extends between the first side section 546-1 and the second side section 546-2 over the top of the connector pins 506. Thus, the pin cover 510 may be seen to straddle the connector pins 506 between the first side section 546-1 and the second side section 546-2. While FIG. 5-2 shows the cover top 548 as being flush with an upper surface of the first side section 546-1 and a second side section 546-2, it should be understood that the cover top 548 may be located at any location between the upper surface of the side sections 546 and a lower surface of the side sections 546.

In the embodiment shown, the first side section 546-1 and the second side section 546-2 may be secured to a pin base 558 with an interlocking connection. For example, in the embodiment shown, the side sections (collectively 546) may include a groove 554. The pin base 558 may include a complementary tongue section 556 that extends from the pin base 558. The tongue section 556 may be inserted into the groove 554 to secure the pin cover 510 to the socket 504. This may help to prevent movement, such as removal, of the pin cover 510 from the socket 504 in the vertical direction 536. While a tongue and groove connection between the pin base 558 and the pin cover 510 is shown in FIG. 5-2, it should be understood that any type of interlocking or sliding connection between the pin base 558 and the pin cover 510 may be used, including a dovetail connection (which may only allow lateral movement in a single direction).

As may be seen, the connector pins 506 extend above the pin base 558 with a pin height 562. The cover top 548 extends above the pin base 558 with a cover height 560. The cover height 560 may be greater than the pin height 562. Thus, the pin cover 510 may not contact the connector pins 506 when installed on the socket 504. Furthermore, the cover height 560 being greater than the pin height 562 may allow the pin cover 510 to be laterally removed (e.g., into and out of the page) without contacting and/or damaging the connector pins 506. In this manner, the pin cover 510 may help to prevent damage to the connector pins 506 during handling and/or assembly of the processor on the socket 504.

In the embodiments shown in FIG. 5-1 and FIG. 5-2, the pin cover 510 shown is integrally formed from a single, unitary piece. For example, the pin cover 510 may be molded in a single mold such that there is no break in material type, composition, or structure along the entirety of the pin cover 510. In some embodiments, the sections of the pin cover 510 may be separately formed and permanently connected or adhered together. A permanent connection or adhesion is one in which the connected elements may not be removed without plastically deforming or fracturing at least one of the elements.

Figure 6:
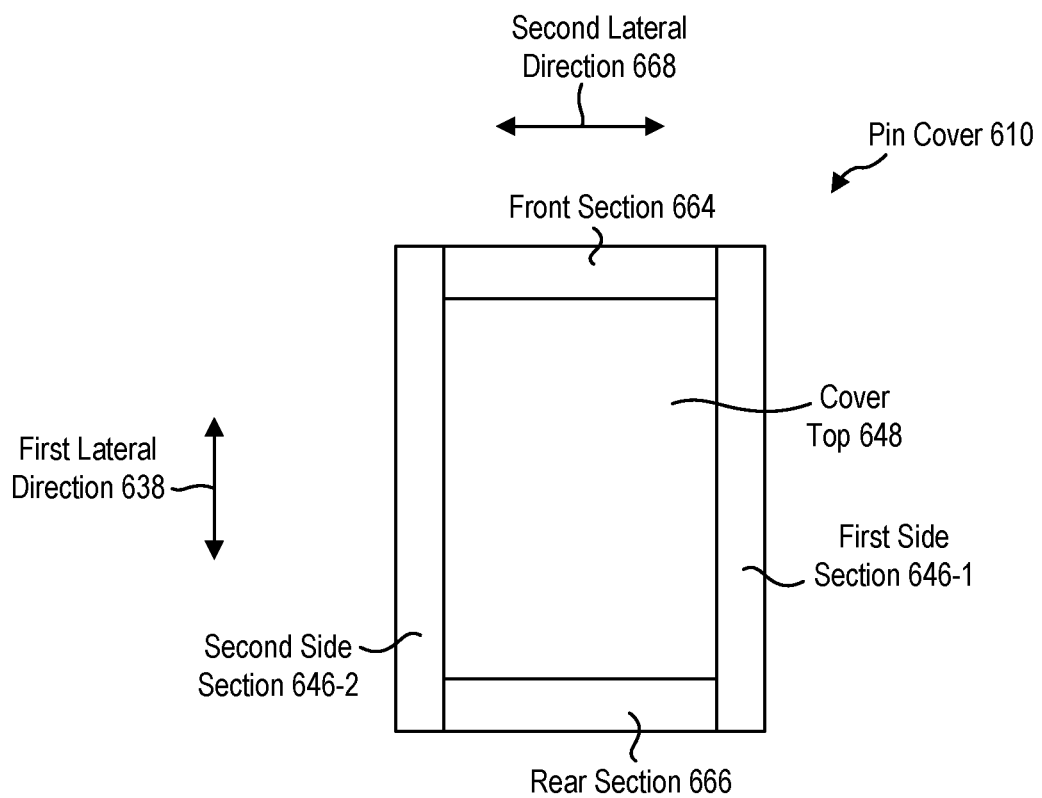
FIG. 6 is a representation of a top down view of another pin cover having a plurality of sections, according to at least one embodiment of the present disclosure.

FIG. 6 is a representation of top down view of a pin cover 610 formed from a plurality of sections, according to at least one embodiment of the present disclosure. The pin cover 610 may include a first side section 646-1, a second side section 646-2, a front section 664, a rear section 666, and a cover top 648. In some embodiments, two or more of the sections may be separately (e.g., independently) formed. Forming the pin cover 610 from two or more sections (e.g., multiple sections) may allow the pin cover 610 to be removed in multiple pieces or from multiple directions. This may allow for a customized installation sequence for a processor assembly (e.g., the processor assembly 213 of FIG. 2-1 through FIG. 2-5) based on the specific geometry of a particular PCB layout.

In some embodiments, any combination of the first side section 646-1, the second side section 646-2, the front section 664, the rear section 666, and the cover top 648 may be separately or integrally formed. For example, a first portion of the cover top 648 may be integrally formed with the first side section 646-1 and a second portion of the cover top 648 may be integrally formed with the second side section 646-1. In some examples, a front portion of the cover top 648 may be integrally formed with the front section 664 and a rear portion of the cover top 648 may be integrally formed with the rear section 666. In some embodiments, the rear section 664 may be integrally formed with the first side section 646-1 and/or the second side section 646-2. In some embodiments, the front section 666 may be integrally formed with the first side section 646-1 and/or the second side section 646-2. Selectively integrally forming different sections of the pin cover 610 may allow a computer designer to customize the installation sequence of the processor assembly to fit a specific geometry of a particular PCB.

In some embodiments, one or more sections of the pin cover 610 may prevent another section from removal in a particular direction. For example, in the embodiment shown in FIG. 6, the first side section 646-1 and the second side section 646-2 may be removed in a first lateral direction 638 or a second lateral direction 668. However, prior to removal, the first side section 646-1 and the second side section 646-2 may prevent the front portion 664 and/or the rear portion 666 from removal in the second lateral direction 668. Thus, to remove the front portion 664 and/or the rear portion 666 in the second lateral direction, the first side section 646-1 and/or the second side section 646-2 may be removed first. By coordinating which of the sections of the pin cover 610 block the other sections, the computing system designer may develop an installation sequence specific to the geometry of a particular PCB.

Figure 7:
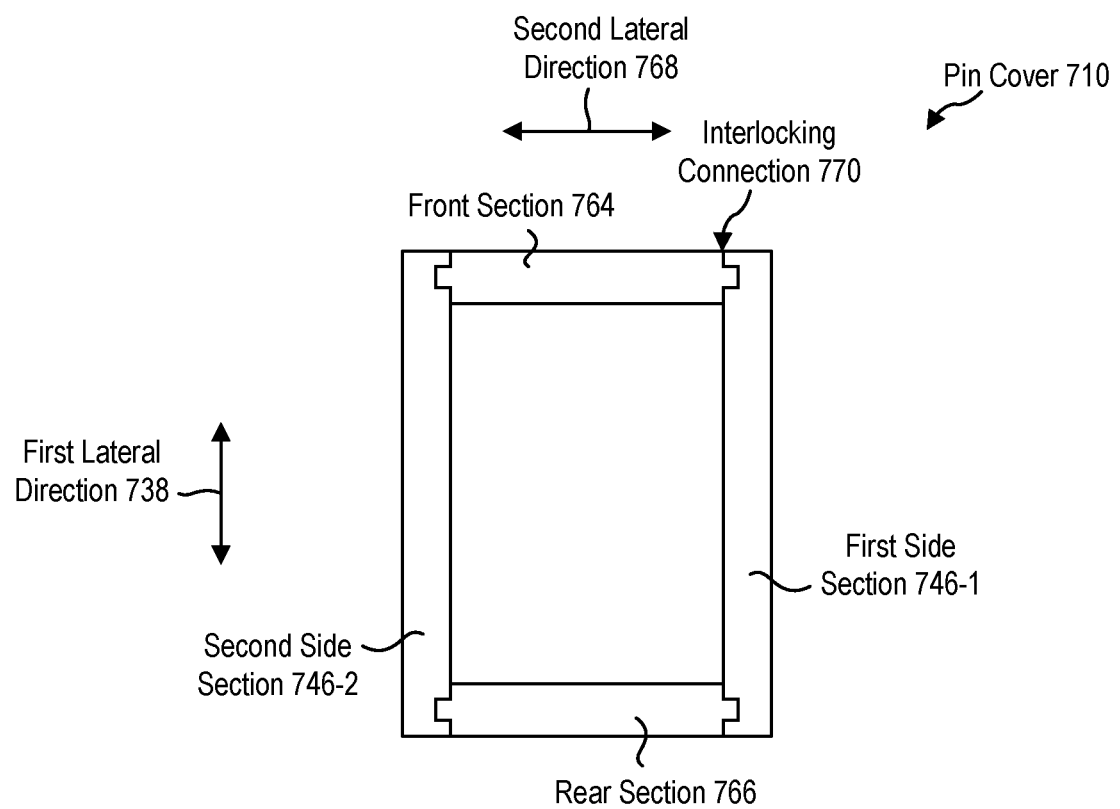
FIG. 7 is a representation of a top down view of yet another pin cover having a plurality of interlocking sections, according to at least one embodiment of the present disclosure.

FIG. 7 is a representation of a top view of a pin cover 710 having multiple interlocking sections, according to at least one embodiment of the present disclosure. The pin cover 710 may include a first side section 746-1, a second side section 746-2, a front section 764, a rear section 766, and a cover top 748. In the embodiment shown, the front section 764 is connected to the first side section 746-1 with an interlocking connection 770. The interlocking connection 770 may prevent removal of one or both of the front section or the first side section 746-1 in the first lateral direction 738 and/or the second lateral direction 768, based on the orientation of the interlocking connection.

The interlocking connection 770 shown may include a notch in the first side section 746-1 and a complementary protrusion in the front section 764. The protrusion may be inserted into the notch. As may be seen the interlocking connection 770 may prevent removal of both the front section 764 and the first side section 746-1 in the first lateral direction 738. Thus, to remove the pin cover 710, the first side section 746 may be removed in the second lateral direction 768. The front section 764 may then be removed in the second lateral direction. Alternatively, the second side section 746-2 may be removed in the second lateral direction 768, and the front section 764 may then be removed in the first lateral direction.

The pin cover 710 may further include other interlocking connections 770. Each of the interlocking connections 770 may prevent removal of one or more of the sections in either the first lateral direction 738 or the second lateral direction 768. Thus, by arranging the pin cover 710 with multiple side sections and multiple interlocking connections 770, a computer designer may design a pin cover 710 that with sections that are removed from a PCB in a particular order. This may further help to protect the connector pins of the socket from damage during handling and/or installation of a processor assembly.

Figure 8:
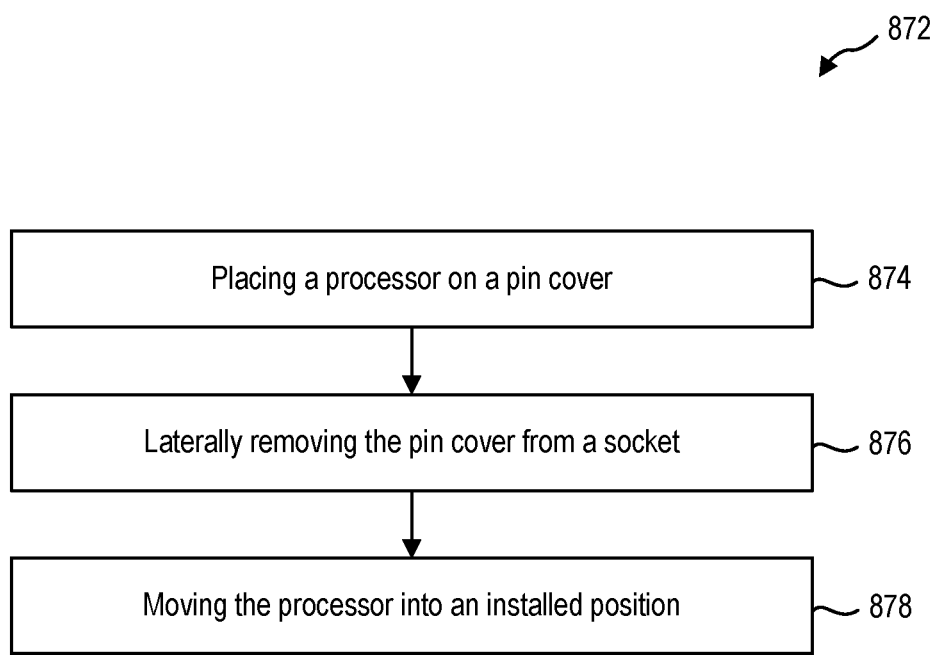
FIG. 8 is a representation of a method for installing a processor on a socket, according to at least one embodiment of the present disclosure.

FIG. 8 is a representation of a method 872 for connecting a processor to a socket, according to at least one embodiment of the present disclosure. The acts and elements of the method 872 may be illustrated graphically in the installation sequence shown in and described with respect to FIG. 2-1 through FIG. 2-5 and the installation sequence shown in and described with respect to FIG. 3-1 through FIG. 3-4. The method 872 may include placing a processor on a laterally removable pin cover connected to the socket at 874. The pin cover may then be laterally removed from the socket at 876 and the processor moved into an installed position at 878.

In some embodiments, the method 872 may include unlatching the laterally removable pin cover before removing the laterally removable pin cover. Unlatching the laterally removable pin cover may include unlatching a latch connecting the laterally removable pin cover to the PCB. The latch may be unlatched when the processor is moved into the cover removal position. In some embodiments, moving the processor into the cover removal position may unlatch the latch by pushing the latch outward away from the pin cover. In some embodiments, the method may further include latching the processor assembly to the PCB using the same latch that latched the laterally removable pin cover to the PCB. The processor assembly may be latched to the PCB when the processor assembly is placed in the final, installed position.

Figure 9:
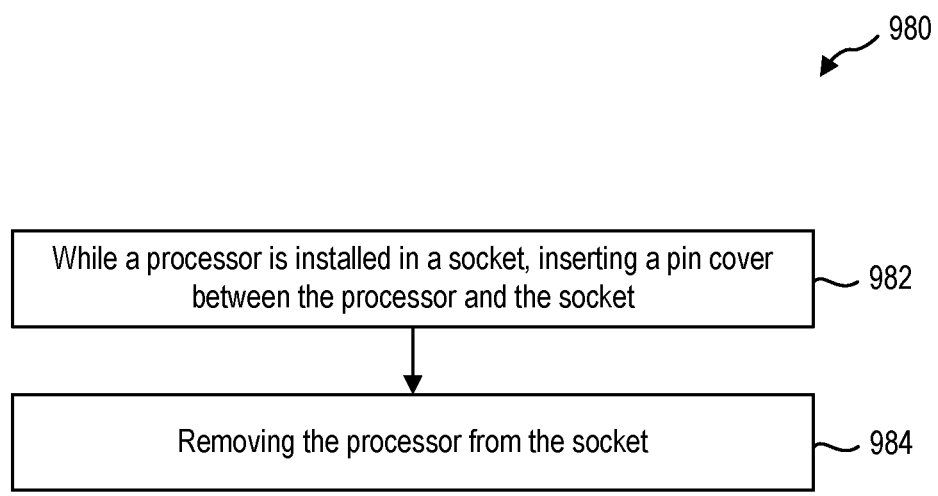
FIG. 9 is a representation of a method for removing a processor from a socket, according to at least one embodiment of the present disclosure.

FIG. 9 is a representation of a method 980 for removing a processor from a socket, according to at least one embodiment of the present disclosure. The acts and elements of the method 980 may be illustrated graphically by following the installation sequence shown in and described with respect to FIG. 2-1 through FIG. 2-5 in reverse order, as well as following the installation sequence shown in and described with respect to FIG. 3-1 through FIG. 3-4 in reverse order. To remove the processor, while the processor is installed in a socket, a pin cover may be inserted between the processor and the socket at 982. After the pin cover is inserted between the processor and the socket, the processor may be removed at 984.

In some embodiments, the method 980 may further include unlatching the processor assembly from the PCB. The processor assembly may be unlatched from the PCB when the pin cover is laterally inserted in between the processor assembly and the PCB. In some embodiments, the pin cover may push the latch away from the processor assembly. When the processor assembly is removed, the latch may then connect with the pin cover, thereby latching the pin cover to the PCB.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A system for protecting a plurality of connector pins during installation of a processor, comprising:
   a socket, wherein the plurality of connector pins are connected to the socket, wherein the plurality of connector pins are configured to contact the processor; and
   a laterally removable pin cover connected to the socket, wherein the pin cover cannot be removed until the processor is in a cover removal position.

2. The system of claim 1, wherein, in the cover removal position, the processor contacts the pin cover.

3. The system of claim 1, wherein the plurality of connector pins extend a pin height above a pin base of the socket, and the pin cover extends a cover height above the pin base, and wherein the cover height is greater than the pin height.

4. The system of claim 1, wherein the pin cover is connected to the socket with an interlocking connection.

5. The system of claim 1, wherein the pin cover comprises a plurality of sections.

6. The system of claim 5, wherein at least two of the plurality of sections are interlocking with each other.

7. The system of claim 1, wherein the pin cover cannot be removed until the processor is adjacent the pin cover.

8. The system of claim 7, wherein the socket includes one or more guide posts, and wherein, in the cover removal position, the processor is secured to the one or more guide posts with a position maintenance feature.

9. The system of claim 1, further comprising a latch securing the pin cover to the socket.

10. The system of claim 9, wherein the latch is unlatched when the processor is placed in a cover removal position.

11. A method for connecting a processor to a socket, comprising:
    placing the processor in a cover removal position above a laterally removable pin cover connected to the socket, wherein the socket includes a plurality of connector pins configured to electrically connect with a plurality of connector pads on the processor;
    engaging the processor with a position maintenance feature to maintain the processor in the cover removal position;
    laterally removing the pin cover from the socket based on the processor being positioned in the cover removal position; and
    moving the processor into an installed position on the socket based on disengaging the processor from the position maintenance feature, wherein, in the installed position, the plurality of connector pins are in contact with the plurality of connector pads on the processor.

12. The method of claim 11, further comprising, in the cover removal position, unlatching a latch securing the pin cover to the socket.

13. The method of claim 11, wherein the pin cover includes a plurality of sections, and wherein laterally removing the pin cover includes laterally removing each section of the plurality of sections individually.

14. The method of claim 11, wherein the pin cover includes a plurality of sections, and wherein laterally removing the pin cover includes laterally removing a first section of the plurality of sections in a first lateral direction and laterally removing a second section of the plurality of sections in a second lateral direction.

15. The method of claim 11, wherein placing the processor in the cover removal position includes aligning the processor over the socket using one or more guide posts.

16. The method of claim 11, wherein, when placing the processor in the cover removal position, the pin cover prevents the plurality of connector pads from contacting the plurality of connector pins.

17. A method for removing a processor assembly from a socket, comprising:
    while the processor assembly is installed on the socket, inserting a pin cover between the processor assembly and the socket; and
    after the pin cover is placed between the processor assembly and the socket, removing the processor assembly from the socket.

18. The method of claim 17, wherein the socket includes a plurality of connector pins, and wherein, when the processor assembly is installed on the socket, a plurality of connector pads of the processor assembly are in contact with the plurality of connector pins, and wherein inserting the pin cover disconnects the plurality of connector pads from the plurality of connector pins.

19. The method of claim 17, further comprising partially removing the processor assembly from the socket before inserting the pin cover.

20. The method of claim 17, further comprising unlatching a latch from the processor assembly when the pin cover is fully inserted.

21. A system for protecting a plurality of connector pins during installation of a processor, comprising:
    a socket assembly including:
        a socket having a plurality of connector pins;
        at least one guide post;
        a pin cover positioned over the plurality of connector pins; and
        a pin cover latch configured to retain the pin cover on the socket assembly; and
    a processor assembly configured to retain a processor and position the processor with respect to the socket; the processor assembly including at least one guide tube for engaging with the at least one guide post to align the processor assembly with respect to the socket assembly, wherein:

an interface of the at least one guide tube and the at least one guide post includes a position maintenance feature to temporarily maintain the processor assembly in a cover removal position; and when in the cover removal position, the processor assembly engages the pin cover latch to enable lateral removal of the pin cover.

22. The system of claim 21, wherein the pin cover comprises a plurality of sections.

23. The system of claim 22, wherein at least two of the plurality of sections are interlocking with each other.

24. The system of claim 21, wherein the pin cover is connected to the socket with an interlocking connection.

25. The system of claim 21, wherein the plurality of connector pins extend a pin height above the pin base of the socket, and the pin cover extends a cover height above the pin base, and wherein the cover height is greater than the pin height.

* * * * *